United States Patent [19]

Komatsu et al.

[11] Patent Number: 5,286,533
[45] Date of Patent: Feb. 15, 1994

[54] METHOD OF MAKING HARD BORON NITRIDE BY A PLASMA CVD METHOD EMPLOYING BEAM IRRADIATION

[75] Inventors: Shojiro Komatsu, Tsukuba; Yusuke Moriyoshi, Tokyo; Mitsuo Kasamatsu, Tsuchiura; Kawakatsu Yamada, Tsukuba, all of Japan

[73] Assignee: National Institute for Research in Inorganic Materials, Ibaraki, Japan

[21] Appl. No.: 82,457

[22] Filed: Jun. 25, 1993

[30] Foreign Application Priority Data

Jun. 25, 1992 [JP] Japan .................. 3-191693

[51] Int. Cl.$^5$ ............................... B05D 3/06
[52] U.S. Cl. .................. 427/554; 427/255.2; 427/314; 427/558; 427/569; 427/585; 427/595; 427/596
[58] Field of Search .......... 427/554, 255.2, 314, 427/554, 558, 569, 585, 595, 596

*Primary Examiner*—Bernard Pianalto
*Attorney, Agent, or Firm*—Oblon, Spivak, McClelland, Maier & Neustadt

[57] ABSTRACT

A method of making hard boron nitride by a plasma CVD method employing beam irradiation comprising the steps of: introducing a boron source gas and a nitrogen source gas into a plasma generated by employing a working gas selected from the group consisted of helium, hydrogen and a mixture of these under pressure of 0.01 through 100 torr, said boron source gas and said nitrogen source gas are provided with volumetric percent of 0.01 through 10% with respect to the working gas; transmitting activating innoculations formed in the plasma to a substrate of which temperature is maintained at 300° through 1100° C; converting the activating innoculations into precursor activating innoculations necessary for forming and growing a hard boron nitride film on the substrate by irradiating an ultraviolet beam to the activation innoculations on the substrate; and accumulating the hard boron nitride on the substrate.

2 Claims, 1 Drawing Sheet

METHOD OF MAKING HARD BORON NITRIDE BY A PLASMA CVD METHOD EMPLOYING BEAM IRRADIATION

BACKGROUND OF THE INVENTION

1. Field of the Invention

This invention relates to a method of making hard boron nitride capable of being employed in surface coating of cutting tools, electronic materials, light emitting diodes and the like.

2. Discussion of the Background

Conventionally, as a synthesizing method of hard boron nitride employing a gas phase synthesizing method without using elevated temperature and high pressure, the following (1) through (6) methods have been tried.

(1) A pulse discharge is performed between a boron electrode which is sintered in a bar-like shape and a water-cooled copper electrode in a mixture gas of nitrogen and hydrogen, and activated boron and nitrogen are reacted and accumulated on a substrate (reactive pulse method).

(2) Hard boron nitride is synthesized by a hot gas phase reaction employing electron beam irradiation (electron beam gas phase reacting method).

(3) Molecular beam deposition is employed wherein borazine ($B_3N_3H_6$) is the raw material and the raw material is accelerated under 1 through 3 KV (molecular beam method).

(4) Nitrogen molecular ions which are accelerated by approximately 30 eV, are injected, while performing electron beam deposition of boron (molecular beam method).

(5) Boron gas and nitrogen gas which are gasified by an electron beam, are ionized by thermions, which are accumulated on a substrate by biasing them (ionized deposition method).

(6) The other methods are the neutralized iron beam method, the laser pulse deposition method and the like.

However, since the film synthesized by the above methods, is a film composed of very fine particles of which grain size is not larger than 500 Å, there is no crystal wall and the film is mixed with h-BN, the film is unstable in air. Accordingly, the film is not regarded as the hard boron nitride film

SUMMARY OF THE INVENTION

It is an object of the present invention, under such a situation, to provide a method of making hard boron nitride composed of boron nitride crystal grains by a gas phase synthesizing method without employing elevated temperature and high pressure.

After an intensive study to achieve the above purpose, the inventors found that a hard boron nitride film can be provided which is composed of cubic boron nitride, wurtzite boron nitride or the like, by employing a plasma CVD method and beam radiation.

According to an aspect of the present invention, there is provided a method of making hard boron nitride by a plasma CVD method employing beam irradiation comprising the steps of:

introducing a boron source gas and a nitrogen source gas into a plasma generated by employing a working gas selected from the group consisted of helium, hydrogen and a mixture of these under pressure of 0.01 through 100 torr, said boron source gas and said nitrogen source gas are provided with volumetric percent of 0.01 through 10% with respect to the working gas;

transmitting activating innoculations formed in the plasma to a substrate of which temperature is maintained at 300° through 1100° C.;

converting the activating innoculations into precursor activating innoculations necessary for forming and growing a hard boron nitride film on the substrate by irradiating an ultraviolet beam to the activation innoculations on the substrate; and accumulating the hard boron nitride on the substrate.

A detailed explanation will be given of the invention further, as follows.

According to the method of making hard boron nitride of this invention, hard boron nitride wherein the grain size is at least 10000 Å, and, therefore, the crystals are remarkably enlarged, is provided. This is because, while the activating innoculations necessary for growing the crystal grains are being generated, the precursor activating innoculations necessary for promoting the grain growth, are efficiently made by the ultraviolet ray irradiation.

To achieve the reaction, the raw material gases are introduced in the plasma generated by the working gas of argon, helium, hydrogen or a mixture of these, and the activating innoculations generated in the plasma are formed on the substrate. As the boron source, $BCl_33$, $B_2H_6$ and the like can be employed and as the nitrogen source, $NH_3$, $N_2$ or the like, compounds containing both boron and nitrogen or a mixture of these can be employed.

In this case, the temperature of the substrate should be maintained at 300° through 1100° C. When the temperature is not larger than 300° C., the structure of the film becomes amorphous. Furthermore, when the temperature is higher than 1100° C., hexagonal boron nitride which is not hard, is formed. As the material for the substrate, silicon, stainless steel or the like can be employed.

The gas pressure in the plasma generation is preferably 0.01 through 100 torr. When the gas pressure is under 0.01 torr, the concentration of the activating innoculations is low, and almost no growths of the film and the grain are promoted. On the other hand, when the gas pressure is higher than 100 torr, since various activating innoculations relate to the growth reaction, it is not possible to grow only hard boron nitride.

Although a flow velocity of gas is not particularly restricted, it is preferable that the flow velocity is in a range of 50 ml/min through 50 l/min to control the temperature of plasma and the velocity of plasma.

The ratio of introducing the raw material gas is determined to be 0.01 through 10 volumetric percent as compared to the working gas. When the ratio is under 0.01 volumetric percent, the growth rate of the film is slow, and almost no growths of the film and the grains take place. Furthermore, when the ratio is larger than 10 volumetric percent, since various activating innoculations relate to the growth reaction, hard boron nitride can not be formed.

In this invention, at the same time with generating the activating innoculations in the plasma, the activating innoculations are converted into the precursor activating innoculations by also employing irradiation of an ultraviolet ray which is irradiated on the surface of the substrate, thereby growing the hard boron nitride film and the grains.

The wavelength range of the laser employed in the ultraviolet ray irradiation is preferably 50 through 400 nm. When the wavelength is out of the range, there is almost no effect of activating the activating innoculations and converting them into the precursor activating innoculations. Furthermore, the laser pulse is preferably 5 through 100 Hz. When the laser pulse is not larger than 5 Hz, the activating effect of the activating innoculations is low. When the laser pulse is not smaller than 100 Hz, local elevation of temperature is remarkable and thermal decomposition of the activating innoculations is accelerated, which is not preferable.

By the similar reason, the laser energy is preferably 5 through 500 mJ/cm$^2$.

BRIEF DESCRIPTION OF THE DRAWING

The figure is a conceptual diagram of an example of a device employed in performing the invented method, which is composed of a CVD device employing a plasma formed by a high-frequency induction furnace and a laser beam.

DETAILED DESCRIPTION OF THE PREFERRED EMBODIMENTS

Figure 1:
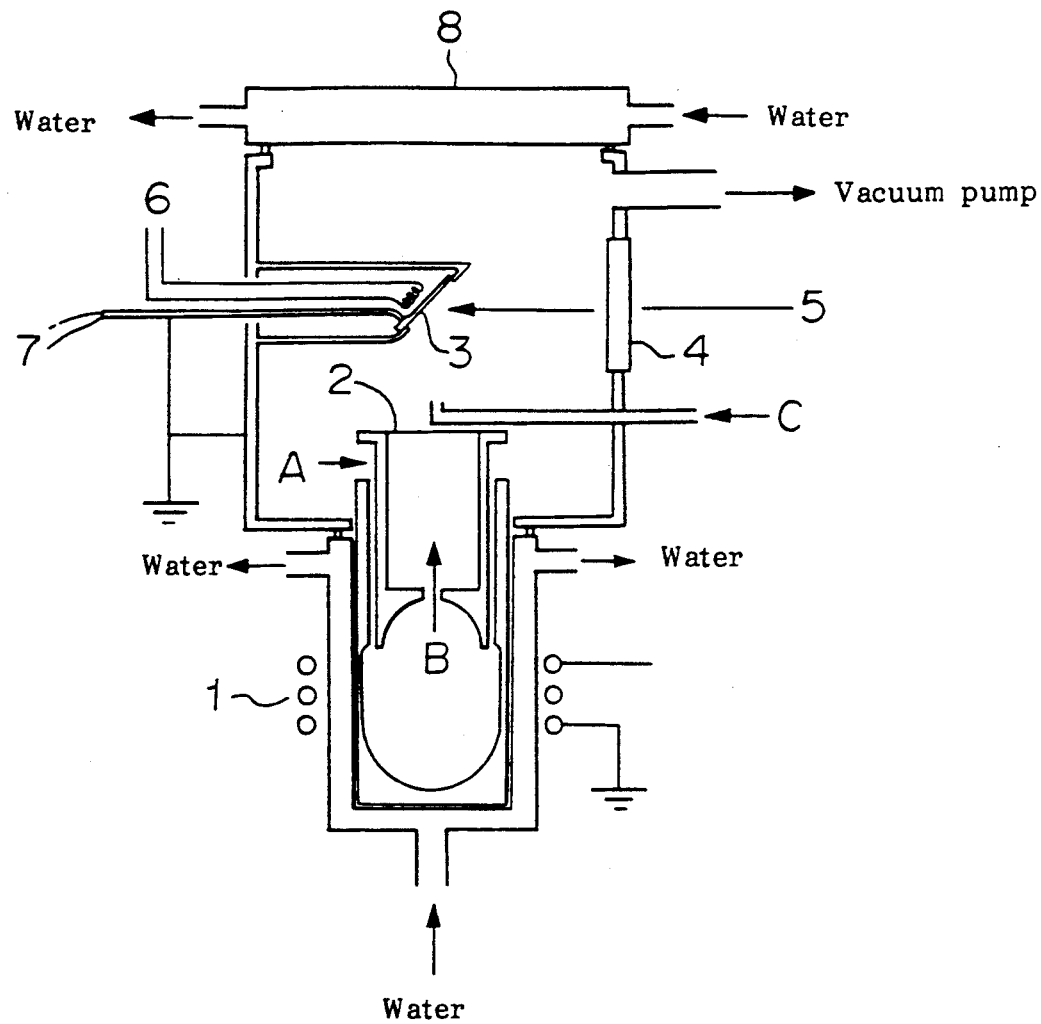

Next, the figure shows an example of a device employed in performing the invented method. Naturally, this invention is not restricted by this device.

In the Figure, a working gas of argon, helium, hydrogen or a mixture of these is introduced from A of a high-frequency induction furnace 1, a plasma is generated at B and the plasma is jetted to the above direction shown by the arrow mark. Due to this mechanism, a steady-state jetting of plasma can always be maintained. A raw material gas is introduced to the upper portion of a jet port 2 from C, which is activated in the plasma. Furthermore, the raw material gas is converted into precursor activating innoculations of hard boron nitride by an exima laser 5 which is incident on a substrate 3 in an oblique direction thereof through a quartz window 4. The precursor activating innoculations grow on the substrate of which temperature is maintained at a predetermined temperature, thereby forming hard boron nitride. The substrate 3 is heated by a direct current output 6 of which temperature is measured by a thermocouple 7. A reference numeral 8 designates a window.

The embodiments of the present invention will be shown as follows.

EXAMPLE 1

$BCl_3$ and $NH_3$ (each 20 ml/min) as the raw material gas, Ar (5 l/min) and $H_2$ (30 ml/min) as the working gas are respectively introduced from C and A of FIG. 1. The film forming is performed for an hour under the condition of a total pressure of 5 torr, a substrate (silicon substrate) temperature of 500° C. and a plasma input of 5 KW, by irradiating an exima laser having a wavelength of 175 nm and a laser pulse of 25 Hz. As a result, a cubic boron nitride film is formed which is composed of crystal grains having the grain size of at least 1 μm.

EXAMPLE 2

$B_2H_6$ (10 ml/min) and $NH_3$ (20 ml/min) as the raw material gas, and Ar (4 l/min) and $H_2$ (30 ml/min) as the working gas are respectively introduced from C and A of the figure. The film forming is performed for an hour under the condition of the total pressure of 3 torr, the substrate (silicon substrate) temperature of 600° C. and the plasma input of 3.5 KW, by irradiating an exima laser having the wavelength of 308 nm and the laser pulse of 25 Hz. As a result, a cubic boron nitride film is formed which is composed of crystal grains having the grain size of not smaller than 1 μm.

As explained above, according to the present invention, the hard boron nitride film can easily be provided which is composed large crystal grains of cubic boron nitride, wurtzite boron nitride or the like, by employing the plasma CVD method and the beam irradiation. This invention is expected to have applications in surface coating of cutting tool, electronic materials, light emitting diodes and the like.

What is claimed is:

1. A method of making hard boron nitride by a plasma CVD method employing beam irradiation comprising the steps of:

introducing a boron source gas and a nitrogen source gas into a plasma generated by employing a working gas selected from the group consisted of helium, hydrogen and a mixture of these under pressure of 0.01 through 100 torr, said boron source gas and said nitrogen source gas are provided with volumetric percent of 0.01 through 10% with respect to the working gas;

transmitting activating innoculations formed in the plasma to a substrate of which temperature is maintained at 300° through 1100° C.;

converting the activating innoculations into precursor activating innoculations necessary for forming and growing a hard boron nitride film on the substrate by irradiating an ultraviolet beam to the activation innoculations on the substrate; and accumulating the hard boron nitride on the substrate.

2. The method of making hard boron nitride by a plasma CVD method employing beam irradiation according to claim 1, wherein the ultraviolet beam is provided with a laser wavelength of 50 through 400 nm, a laser pulse of at least 5 Hz and a laser energy of 5 through 1000 mJ/cm$^2$.

* * * * *